US006670629B1

(12) United States Patent
Wilson

(10) Patent No.: US 6,670,629 B1
(45) Date of Patent: Dec. 30, 2003

(54) INSULATED GATE FIELD EMITTER ARRAY

(75) Inventor: Colin Wilson, Niskayuna, NY (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/235,555

(22) Filed: Sep. 6, 2002

(51) Int. Cl.[7] .............................................. H01L 21/00

(52) U.S. Cl. .......................... 257/10; 257/79; 313/309; 313/313

(58) Field of Search ............................ 438/20; 257/10, 257/79; 313/309, 313, 336

(56) References Cited

U.S. PATENT DOCUMENTS

| | | | | |
|---|---|---|---|---|
| 5,561,340 A | | 10/1996 | Jin et al. | |
| 5,598,056 A | | 1/1997 | Jin et al. | |
| 5,646,479 A | | 7/1997 | Troxell | |
| 5,655,514 A | | 8/1997 | Kowald et al. | |
| 5,656,525 A | | 8/1997 | Lin et al. | |
| 5,688,707 A | | 11/1997 | Lee et al. | |
| 5,690,530 A | | 11/1997 | Jin et al. | |
| 5,702,281 A | | 12/1997 | Huang et al. | |
| 5,704,820 A | | 1/1998 | Chandross et al. | |
| 5,717,278 A | | 2/1998 | Bartha et al. | |
| 5,731,597 A | | 3/1998 | Lee et al. | |
| 5,828,163 A | | 10/1998 | Jones et al. | |
| 5,828,288 A | | 10/1998 | Jones et al. | |
| 5,831,378 A | * | 11/1998 | Rolfson et al. | 313/336 |
| 5,857,884 A | | 1/1999 | Zimlich | |
| 5,863,233 A | | 1/1999 | Porter et al. | |
| 5,872,019 A | | 2/1999 | Lee et al. | |
| 5,930,590 A | | 7/1999 | Busta | |
| 5,939,833 A | | 8/1999 | Song et al. | |
| 5,969,473 A | | 10/1999 | Huang et al. | |
| 6,007,396 A | | 12/1999 | Williams | |
| 6,008,064 A | | 12/1999 | Busta | |
| 6,148,061 A | | 11/2000 | Shefer et al. | |
| 6,181,060 B1 | * | 1/2001 | Rolfson | 313/495 |
| 6,232,705 B1 | | 5/2001 | Forbes et al. | |
| 6,239,538 B1 | | 5/2001 | Konuma | |
| 6,394,871 B2 | * | 5/2002 | Lee | 445/24 |

* cited by examiner

*Primary Examiner*—Carl Whitehead, Jr.
*Assistant Examiner*—David S Blum
(74) *Attorney, Agent, or Firm*—Foley & Lardner

(57) ABSTRACT

There is provided a field emitter array on a substrate. The field emitter array includes field emitter devices. At least one of the field emitter devices includes a conducting gate layer having a top surface and at least one side surface, disposed over the substrate. The at least one of the field emitter devices also includes a field emitter tip disposed on the substrate adjacent the at least one side surface, and an insulating layer disposed at least on at least one side surface adjacent the field emitter tip to prevent arcing between the field emitter tip and the conducting gate layer.

22 Claims, 4 Drawing Sheets

INSULATED GATE FIELD EMITTER ARRAY

BACKGROUND OF THE INVENTION

This invention is related generally to field emitter devices and field emitter arrays incorporating such devices.

Field emitter arrays (FEAs) generally include an array of field emitter devices. Each emitter device, when properly driven, can emit electrons from the tip of the device. Field emitter arrays have many applications, one of which is in field emitter displays (FEDs), which can be implemented as a flat panel display.

FIG. 1 illustrates a portion of a conventional Field Emitter Device. The field emitter device 1 shown in FIG. 1 is often referred to as a "Spindt-type" FEA. It includes a field emitter tip 12 formed on a semiconductor substrate 10. Refractory metal, carbide, diamond and silicon tips, silicon carbon nanotubes and metallic nanowires are some of the structures known to be used as field emitter tips 12. The field emitter tip 12 is adjacent to an insulating layer 14 and a conducting gate layer 16. By applying an appropriate voltage to the conducting gate layer 16, the current to the field emitter tip 12 passing through semiconductor substrate 10 is controlled.

FEAs typically operate in very high vacuums (often better than $10^{-8}$ Torr for Spindt types and nanowires and $10^{-7}$ Torr for nanotubes). This is because the gate voltages required to generate field emitted currents are also sufficient to produce an arc discharge between the gate and emitting tip at higher pressure levels consistent with other low vacuum electronic products. The vacuum requirements limit the number of FEA applications to those employing expensive high vacuum systems. The FEAs must also be handled with extreme care, often in clean rooms, because a simple dust particle can short out the gate-emitter circuit and destroy the device.

Thus, prior art FEAs, either those based on refractory metal tips or nanotubes or nanowires, are prone to arcing, and require good vacuums ($10^{-7}$ Torr or better) for operation. Further, prior art FEAs are sensitive to contamination by dust, skin oils etc. which can short out the devices. These requirements make prior art FEAs both difficult to handle and to utilize.

SUMMARY OF THE INVENTION

In accordance with one aspect of the present invention, there is provided a field emitter device on a substrate. The field emitter device comprises a first insulating layer, on the substrate; a conducting gate layer having a top surface and at least one side surface, disposed on the first insulating layer; a field emitter tip disposed on the substrate adjacent the first insulating layer and adjacent to the at least one side surface; and a second insulating layer disposed at least on at least one side surface located adjacent the field emitter tip to prevent arcing between the field emitter tip and the conducting gate layer.

In accordance with another aspect of the present invention, there is provided a field emitter array comprising an array of field emitter devices on a substrate. At least one of the field emitter devices of the array comprises a first insulating layer on the substrate; a conducting gate layer having a top surface and at least one side surface, disposed on the first insulating layer; a field emitter tip disposed on the substrate adjacent the first insulating layer and adjacent to the at least one side surface; and a second insulating layer disposed at least on at least one side surface located adjacent the field emitter tip to prevent arcing between the field emitter tip and the conducting gate layer.

In accordance with another aspect of the present invention, there is provided a method of forming a field emitter device on a substrate. The method comprises forming a first insulating layer on the substrate; forming a conducting gate layer having a top surface and at least one side surface on the first insulating layer; forming a field emitter tip on the substrate adjacent the first insulating layer and the conducting layer; and forming a second insulating layer on at least one side surface of the conducting gate layer adjacent the field emitter tip to prevent arcing between the field emitter tip and the conducting gate layer.

In accordance with another aspect of the present invention, there is provided a field emitter device on a substrate. The device comprises a first insulating layer on the substrate; a conducting gate layer having a top surface and at least one side surface, disposed on the first insulating layer; a field emitter tip disposed on the substrate adjacent the first insulating layer and adjacent to the at least one side surface; and an arc prevention layer disposed at least on at least one side surface located adjacent the field emitter tip to prevent arcing between the field emitter tip and the conducting gate layer.

In accordance with another aspect of the present invention, there is provided a field emitter array comprising an array of field emitter devices on a substrate. At least one of the field emitter devices of the array comprises a first insulating layer on the substrate; a conducting gate layer having a top surface and at least one side surface, disposed on the first insulating layer; a field emitter tip disposed on the substrate adjacent the first insulating layer and adjacent to the at least one side surface; and an arc prevention layer disposed at least on at least one side surface located adjacent the field emitter tip to prevent arcing between the field emitter tip and the conducting gate layer.

In accordance with another aspect of the present invention, there is provided a method of forming a field emitter device on a substrate. The method comprises forming a first insulating layer on the substrate; forming a conducting gate layer having a top surface and at least one side surface on the first insulating layer; forming a field emitter tip on the substrate adjacent the first insulating layer and the conducting layer; and forming an arc prevention layer on at least one side surface of the conducting gate layer adjacent the field emitter tip to prevent arcing between the field emitter tip and the conducting gate layer.

DETAILED DESCRIPTION OF THE PREFERRED EMBODIMENTS

The present inventor has realized that arcing from a conducting gate layer to an adjacent field emitter tip can be prevented by coating at least one side of the conducting gate layer of the device with an insulating layer. This FEA is less susceptible to discharge between the emitter tip and gate and to particle contamination and may operate at relatively low pressure levels compared to prior art FEAs.

Figure 1:
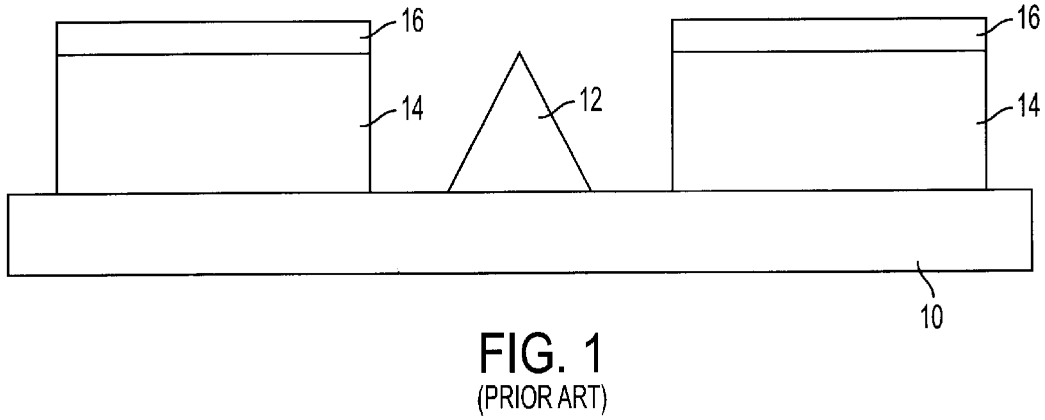
FIG. 1 (PRIOR ART)
FIG. 1 is a side cross sectional view of a prior art field emitter device.
Figure 2:
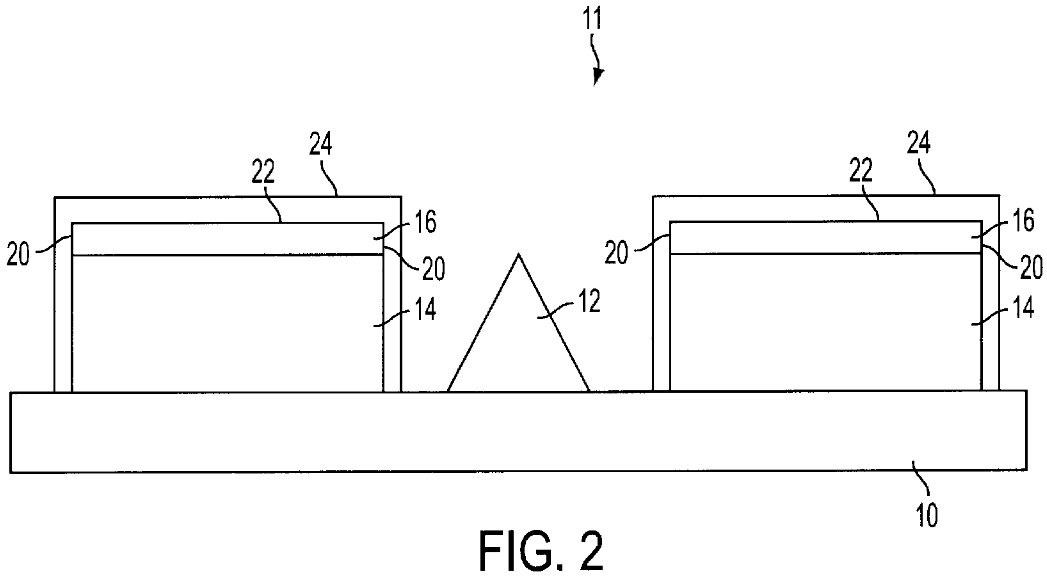
FIG. 2 is a side cross sectional view of a field emitter device of a portion of an FEA according to a preferred embodiment of the invention.
Figure 3:
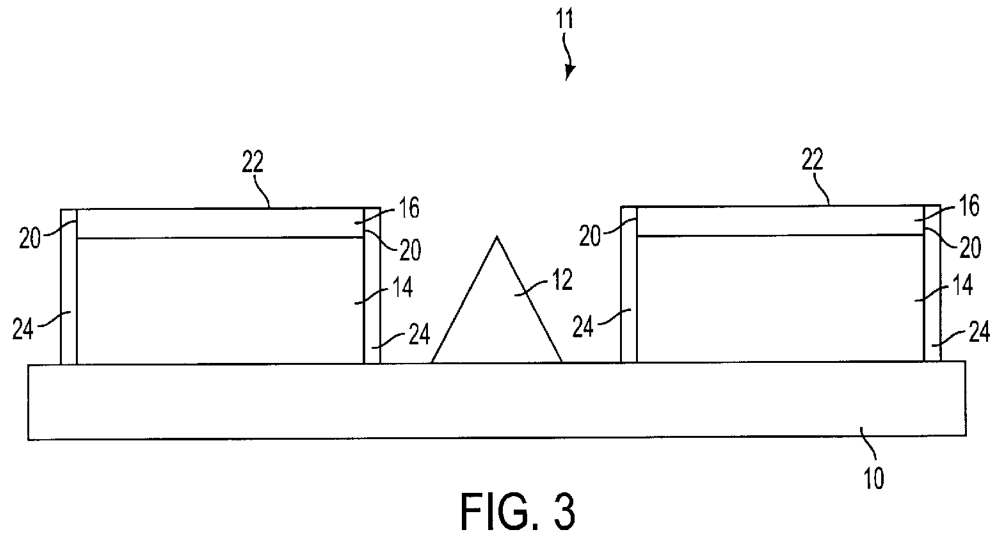
FIG. 3 is a side cross sectional view of a field emitter device according to another preferred embodiment of the invention.

FIGS. 2 and 3 are schematic illustrations of a field emitter device according to preferred embodiments of the invention, where at least one side of the conducting gate layer is insulated from the adjacent emitter tip. FIGS. 2 and 3 illustrate a single field emitter device with a single field emitter tip for ease of illustration. In implementation, the FEA has an array of field emitter tips where the current to each tip is controlled by its respective gate. Because these embodiments describe an FEA with a gate that is insulated at least at one side, this array is called an insulated gate field emitter array (IGFEA).

The field emitter device 11 shown in FIGS. 2 and 3 includes a field emitter tip 12 formed on a substrate 10. The field emitter tip 12 is adjacent to a first insulating layer 14 and a conducting gate layer 16 on the insulating layer 14. The voltage to the conducting gate layer 16 may be controlled by other circuitry (not shown) on the substrate 10 as known in the art. The conducting gate layer 16 has a top surface 22 and side surfaces 20.

In addition to the first insulating layer 14, the field emitter device includes a second arc prevention insulating layer 24. The second insulating layer 24 is disposed at least on the conducting gate layer 16 side surfaces 20 so as to prevent arcing between the field emitter tip 12 and the conducting gate layer 16. Preferably the second insulating layer 24 also covers the top surface 22 of the conducting gate layer 16 as shown in FIG. 2. However, forming the second insulating layer 24 on the side surfaces 20 may be sufficient to prevent any reasonable chance of arcing and the second insulating layer 24 may be omitted from the top surface 22 as shown in FIG. 3.

The second insulating layer 24 prevents arcing between the emitter tip 12 and the conducting gate layer 16. Thus, the field emitter device 11 of FIGS. 2 and 3 is more robust than conventional field emitter devices. The second insulating layer 24 prevents arcing by allowing no direct conduction path between gate conducting layer 16 and the emitter tip 12. This means that any micro-discharge that forms in the gate-emitter tip vacuum space cannot grow into a full arc. Any micro-discharge that forms will deposit charge on the insulator 24 which will oppose the further growth of the discharge. The discharge will therefore be inhibited, the arc will be prevented and the device 11 is thus more robust.

Furthermore, because arcing is prevented, the emitter device may be used in higher pressure environments where conventional FEAs are particularly susceptible to arcing. Thus, embodiments of the present invention increase the applications possible for FEAs.

Also, because discharge between the emitter tip 12 and the gate conducting layer 16 is prevented, the embodiments of the present invention are less susceptible to particle contamination, which might otherwise increase the likelihood of a discharge or shorting between the emitter tip 12 and the gate conducting layer 16.

The substrate 10, may be formed of any suitable material, such as a semiconductor material. Exemplary semiconductor materials include silicon, germanium and III-V semiconductor materials such as GaAs, but others may be used. The substrate, may also comprise an insulating material, such as glass or plastic for example, with a semiconductor layer formed on the insulating material. In this case the substrate will comprise a semiconductor material, but will also comprise an underlying insulating (or conducting) material. Preferably, the substrate 10 is doped such that the gate 16, when an appropriate voltage is applied, will allow current to flow to the emitter tip 12. Thus, the gate 16 controls the flow of current to the emitter tip.

The first insulating layer 14 material may be formed by blanket depositing a first insulating material, by any suitable technique, such as CVD or sputtering, followed by patterning the first insulating material. Patterning the first insulating material may be performed using photolithographic techniques, which are well known in the art. Alternatively, the first insulating layer 14 material may be formed by growing a first insulating material directly on the substrate 10, followed by patterning the first insulating material, or by selectively growing the first insulating material on the substrate. The first insulating material may be, for example, silicon dioxide or silicon nitride.

If the first insulating layer 14 is formed by growing a material on the substrate, the first insulating layer 14 may be formed by exposing the substrate 10 to an oxidizing atmosphere. For example, if the substrate 10 is silicon, the first insulating layer 14 may be formed by exposing the substrate to oxygen gas or water vapor.

The first insulating layer 14 may be formed to a thickness of between about 0.5 $\mu$m and 5 $\mu$m, and more preferably between about 0.5 $\mu$m and 1.5 $\mu$m. The thickness of the first insulating layer 14 will depend upon the particular device formed, and it should be thick enough to support an appropriate gate voltage. The thickness of the first insulating layer 14 may be, for example, about 2.5 $\mu$m. The spacing between the first insulating layers 14 may be, for example, about 1.5 $\mu$m.

The conducting gate layer 16 may be formed by depositing a conducting material on the first insulating layer 14. The conducting material may be a metal, such as a refractory metal, for example. The conducting material may be one of molybdenum, niobium, chromium and hafnium, or combinations of these materials and their carbides, for example. Other conducting materials may be used as are known in the art. The conducting material may be deposited by physical vapor deposition techniques, such as evaporation or sputtering, or by chemical vapor deposition (CVD) techniques. The conducting material may be deposited in the region between first insulating layers 14, in addition to on the first insulating layer 14 especially if the conducting gate layer 16 is much thinner than the first insulating layer 14. The conducting gate layer 16 may be formed to a thickness of between about 0.1 $\mu$m and 1 $\mu$m, for example. The thickness of the conducting gate layer 16 may be, for example, about 0.4 $\mu$m. The thickness of the conducting gate layer 16 will be dependent upon the particular device formed, and should be thick enough to allow conduction of the gate current, as is known in the art.

The conducting gate layer 16 first insulating layer 14 may be formed by depositing the first insulating layer 14 and then the conducting gate layer 16 on the first insulating layer 14, followed by photolithographically patterning both layers. Alternatively, the first insulating layer 14 may be patterned first followed by patterning the conducting gate layer 16.

The field emitter tip 12 may be formed as a refractory metal tip, a nanotube, a nanowire or other types of emitter tips. If the field emitter tip 12 is formed as a refractory metal tip, the tip 12 may be formed by the so-called "Spindt process". An example of a Spindt process for depositing a refractory metal tip, for example, is provided in U.S. Pat.

No. 5,731,597 to Lee et al, which is incorporated by reference. If the emitter tip 12 comprises a refractory metal, the emitter tip 12 may be formed of molybdenum, niobium, or hafnium, or combinations of these materials, for example.

The field emitter tip 12 may also be formed as a nanotube or nanowire. For example, the emitter tip 12 may be formed as a carbon nanotube or a nanowire. The nanowire may be ZnO, a refractory metal, a refractory metal carbides, or diamond, for example. Carbon nanotubes may be formed using electric discharge, pulsed laser ablation or chemical vapor deposition, for example. Nanowires can be grown by several known methods, but preferably using electrodeposition.

The second insulating layer 24 is preferably formed at least on the side surfaces 20 of the conducting layer 16 that are adjacent to an emitter tip 12. The second insulating layer 24 may be formed by blanket deposition of the second insulating material on the substrate (and on the gate conducting layer 16) followed by patterning the second insulating material. In this regard, it may be preferable to deposit the second insulating material before the emitter tip 12 is formed, and then to pattern the second insulating material to remove the second insulating material from regions between the gate conducting layer 16 and first insulating layer 14 stack. Thus, the emitter tip 12 may be formed after the second insulating layer 24 is formed. Blanket deposition techniques include for example, sputtering and CVD. Layer 24 may comprise any suitable insulating material, such as silicon dioxide, silicon nitride and silicon oxy-nitride.

Alternatively, if the second insulating material is to be removed from the top surface 22 of the gate conducting layer 16, the second insulating material may be blanket deposited followed by a directional etch back, such as reactive ion etching, to remove the second insulating material everywhere except the side surfaces 20 of the gate conducting layer 16 and the side surfaces of the first insulating layer 14. In this case, the second insulating layer 24 will be formed as sidewalls on the gate conducting layer 16 and first insulating layer 14 stack.

As another alternative, the material of the gate conducting layer 16 and the second insulating material may be chosen such that a selective deposition process for the second insulating material deposits the second insulating layer 24 only on the gate conducting layer 16, or only on the gate conducting layer 16 and the first insulating layer 14.

As an example of a selective deposition technique to form the second insulating layer 24 on the gate conducting layer 16, anodic oxidation may be used to form the second insulating layer 24. In this case the structure may be immersed in appropriate solution for anodic oxidation and appropriate voltages are applied.

As another alternative, the second insulating material may be directionally deposited at an angle with respect to the vertical (perpendicular to the substrate) such that the gate conducting layer 16 first insulating layer 14 stacks act as a shadow mask and the second insulating material is deposited only on the gate conducting layer 16, or only on the gate conducting layer 16 and the first insulating layer 14. In this regard the second insulating material may be directionally deposited by sputtering.

FIGS. 2 and 3 illustrate a gate conducting layer 16 where the top surface 22 and side surfaces 20 are flat. Of course, the top surface 22 and side surface 20 need not be flat, but may be curved. Curved surfaces may occur, for example, when the underlying first insulating layer 14 has a curved surface.

Figure 4:
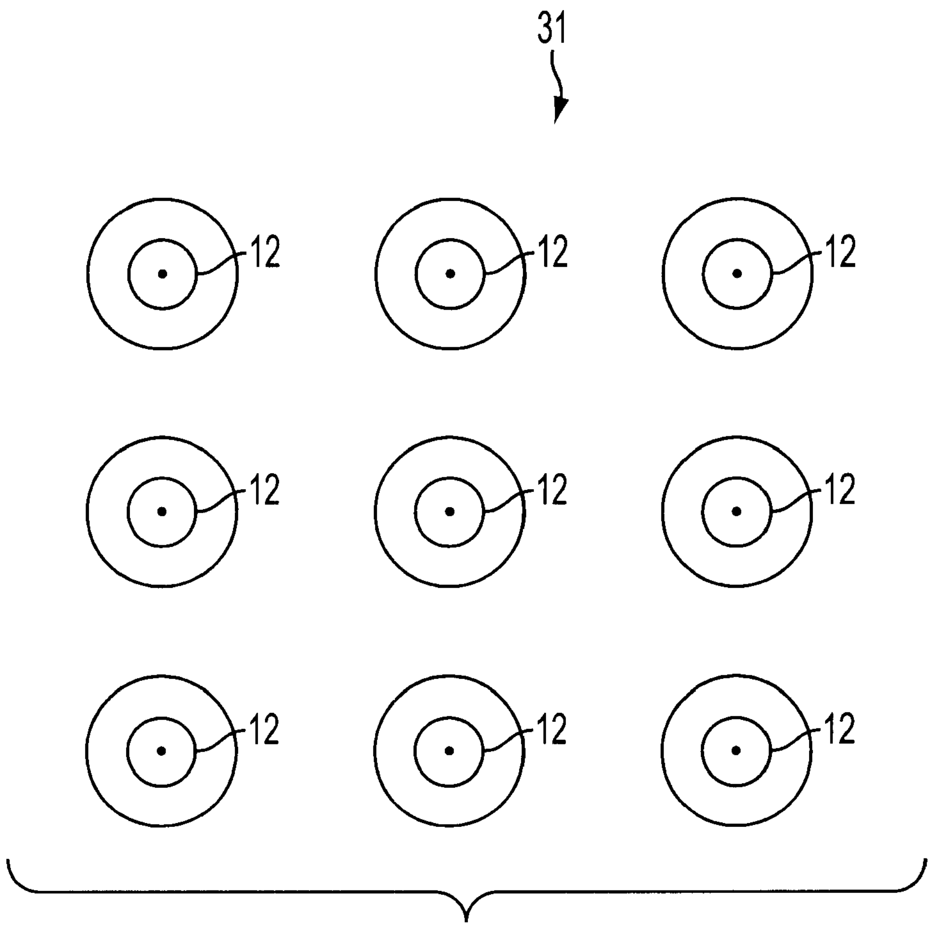
FIG. 4 is a top view of illustrating the arrangement of emitter tips in a portion of an FEA according to a preferred embodiment of the invention.

FIG. 4 is a top view of the FEA 31 showing a number of field emitter tips 12 arranged in an array. In general, the number of field emitter tips in an FEA will be much larger than that illustrated in FIG. 4. A lesser number is shown for ease of illustration.

The embodiments of FIGS. 2 and 3 disclose forming a second insulating layer 24 on at least one side surface 20 or also on a top surface 22 of a conducting gate layer 16. As an alternative, the second insulating layer 24 may be replaced with an arc prevention layer generally. In this case, the arc prevention layer may comprise semiconductor material which is preferably undoped or lightly doped. The arc prevention layer may also include insulating material in addition to the semiconductor material.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A field emitter device on a substrate, comprising:

a first insulating layer on the substrate;

a conducting gate layer having a top surface and at least one side surface, disposed on the first insulating layer;

a field emitter tip disposed on the substrate adjacent the first insulating layer and adjacent to the at least one side surface; and a second insulating layer disposed at least on at least one side surface located adjacent the field emitter tip to prevent arcing between the field emitter tip and the conducting gate layer.

2. The field emitter device of claim 1, wherein the first insulating layer comprise one of silicon dioxide, silicon oxynitride and silicon nitride.

3. The field emitter device of claim 1, wherein the second insulating layer covers the top surface of the conducting gate layer.

4. The field emitter device of claim 1, wherein the field emitter tip comprises one of a refractory metal tip, a nanotube and a nanowire.

5. The field emitter device of claim 1, wherein the field emitter tip comprises a nanowire comprising one of ZnO, refractory metal, refractory metal carbides, and diamond.

6. The field emitter device of claim 4, wherein the field emitter tip comprises a refractory metal tip comprising one of molybdenum, niobium and hafnium.

7. The field emitter device of claim 1, wherein the field emitter tip comprises a carbon nanotube.

8. The field emitter device of claim 1, wherein the substrate comprises a semiconductor.

9. The field emitter device of claim 8, wherein the substrate comprises one of silicon, germanium and gallium arsenide.

10. A field emitter array comprising an array of field emitter devices on a substrate, at least one of the field emitter devices of the array comprising:

a first insulating layer on the substrate;

a conducting gate layer having a top surface and at least one side surface, disposed on the first insulating layer;

a field emitter tip disposed on the substrate adjacent the first insulating layer and adjacent to the at least one side surface; and a second insulating layer disposed at least on at least one side surface located adjacent the field emitter tip to prevent arcing between the field emitter tip and the conducting gate layer.

11. The field emitter array of claim 10, wherein the first insulating layer is one of silicon dioxide, silicon oxynitride and silicon nitride.

12. The field emitter array of claim 10, wherein the second insulating layer covers the top surface of the gate conducting layer.

13. The field emitter array of claim 10, wherein the field emitter tip comprises one of a refractory metal tip, a nanotube and a nanowire.

14. The field emitter array of claim 10, wherein the field emitter tip comprises a refractory metal tip comprising one of molybdenum, niobium and hafnium.

15. The field emitter array of claim 10, wherein the field emitter tip comprises a carbon nanotube.

16. The field emitter array of claim 10, wherein the field emitter tip comprises a nanowire comprising one of ZnO, refractory metal, refractory metal carbides, and diamond.

17. The field emitter array of claim 10, wherein the substrate comprises a semiconductor.

18. The field emitter array of claim 17, wherein the substrate comprises one of silicon, germanium and gallium arsenide.

19. A field emitter device on a substrate, comprising:

a first insulating layer on the substrate;

a conducting gate layer having a top surface and at least one side surface, disposed on the first insulating layer;

a field emitter tip disposed on the substrate adjacent the first insulating layer and adjacent to the at least one side surface; and an arc prevention layer disposed at least on at least one side surface located adjacent the field emitter tip to prevent arcing between the field emitter tip and the conducting gate layer.

20. The field emitter device of claim 19 wherein the arc prevention layer comprises a semiconductor material.

21. A field emitter array comprising an array of field emitter devices on a substrate, at least one of the field emitter devices of the array comprising:

a first insulating layer on the substrate;

a conducting gate layer having a top surface and at least one side surface, disposed on the first insulating layer;

a field emitter tip disposed on the substrate adjacent the first insulating layer and adjacent to the at least one side surface; and an arc prevention layer disposed at least on at least one side surface located adjacent the field emitter tip to prevent arcing between the field emitter tip and the conducting gate layer.

22. The field emitter array of claim 21 wherein the arc prevention layer comprises a semiconductor material.

* * * * *